United States Patent
Huang et al.

(10) Patent No.: US 9,871,037 B2
(45) Date of Patent: Jan. 16, 2018

(54) STRUCTURES AND METHODS FOR FABRICATING SEMICONDUCTOR DEVICES USING FIN STRUCTURES

(71) Applicant: Taiwan Semiconductor Manufacturing Company Limited, Hsinchu (TW)

(72) Inventors: Yu-Lien Huang, Hsinchu County (TW); Chi-Kang Liu, Taipei (TW); Yung-Ta Li, Kaohsiung (TW); Chun-Hsiang Fan, Taoyuan County (TW); Tung-Ying Lee, Hsinchu (TW); Clement Hsing-Jen Wann, Carmel, NY (US)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 138 days.

(21) Appl. No.: 14/190,184

(22) Filed: Feb. 26, 2014

(65) Prior Publication Data
US 2015/0243659 A1    Aug. 27, 2015

(51) Int. Cl.
| | | |
|---|---|---|
| *H01L 27/088* | (2006.01) | |
| *H01L 29/161* | (2006.01) | |
| *H01L 29/06* | (2006.01) | |
| *H01L 21/762* | (2006.01) | |
| *H01L 21/8234* | (2006.01) | |

(52) U.S. Cl.
CPC .... *H01L 27/0886* (2013.01); *H01L 21/76224* (2013.01); *H01L 21/823431* (2013.01); *H01L 21/823481* (2013.01); *H01L 29/0653* (2013.01); *H01L 29/161* (2013.01)

(58) Field of Classification Search
CPC ............ H01L 29/66795; H01L 29/785; H01L 29/165; H01L 29/66545; H01L 21/02142; H01L 21/02164; H01L 21/02236; H01L 21/02532; H01L 21/30604; H01L 21/324; H01L 29/0847; H01L 29/1037; H01L 29/16
USPC .................... 438/283; 257/192, 190, 288, 77
See application file for complete search history.

(56) References Cited

U.S. PATENT DOCUMENTS

| | | | |
|---|---|---|---|
| 2010/0022061 A1* | 1/2010 | Wu ................. | H01L 21/823468 438/301 |
| 2012/0012932 A1* | 1/2012 | Perng .................... | H01L 29/165 257/347 |
| 2013/0075821 A1* | 3/2013 | Baars ................ | H01L 29/66545 257/368 |

(Continued)

*Primary Examiner* — Edward Chin
(74) *Attorney, Agent, or Firm* — Jones Day

(57) ABSTRACT

A shallow trench isolation (STI) structure is formed on a substrate. Part of the STI structure is removed to form a first fin structure and a second fin structure extending above a support structure on the substrate. A first part of the STI structure is located between the first fin structure and the second fin structure and has a first top surface higher than an interface between the first fin structure and the support structure. A second part of the STI structure is located adjacent to the first fin structure and has a second top surface lower than the interface between the first fin structure and the support structure. An etching process is performed to remove part of the first fin structure and the second fin structure. Part of the support structure adjacent to the second part of the STI structure is removed during the etching process.

19 Claims, 7 Drawing Sheets

(56) References Cited

U.S. PATENT DOCUMENTS

| | | | |
|---|---|---|---|
| 2014/0197457 A1* | 7/2014 | Wang | H01L 29/785 257/192 |
| 2014/0353731 A1* | 12/2014 | Colinge | H01L 29/7843 257/288 |
| 2015/0206939 A1* | 7/2015 | Huang | H01L 29/66628 257/77 |

* cited by examiner

STRUCTURES AND METHODS FOR FABRICATING SEMICONDUCTOR DEVICES USING FIN STRUCTURES

BACKGROUND

The technology described in this disclosure relates generally to semiconductor devices and more particularly to fabrication of semiconductor devices.

As feature sizes of semiconductor devices continue to shrink, various problems, such as short-channel effects and poor sub-threshold characteristics, often become severe in traditional planar devices. Novel device geometries with enhanced performance, such as FinFETs, have been explored to push toward higher packing densities in devices and circuits. FinFETs usually include semiconductor fin structures formed vertically on a substrate. One or more gate structures are formed over and along the sides of the fin structures to produce faster, more reliable and better-controlled transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
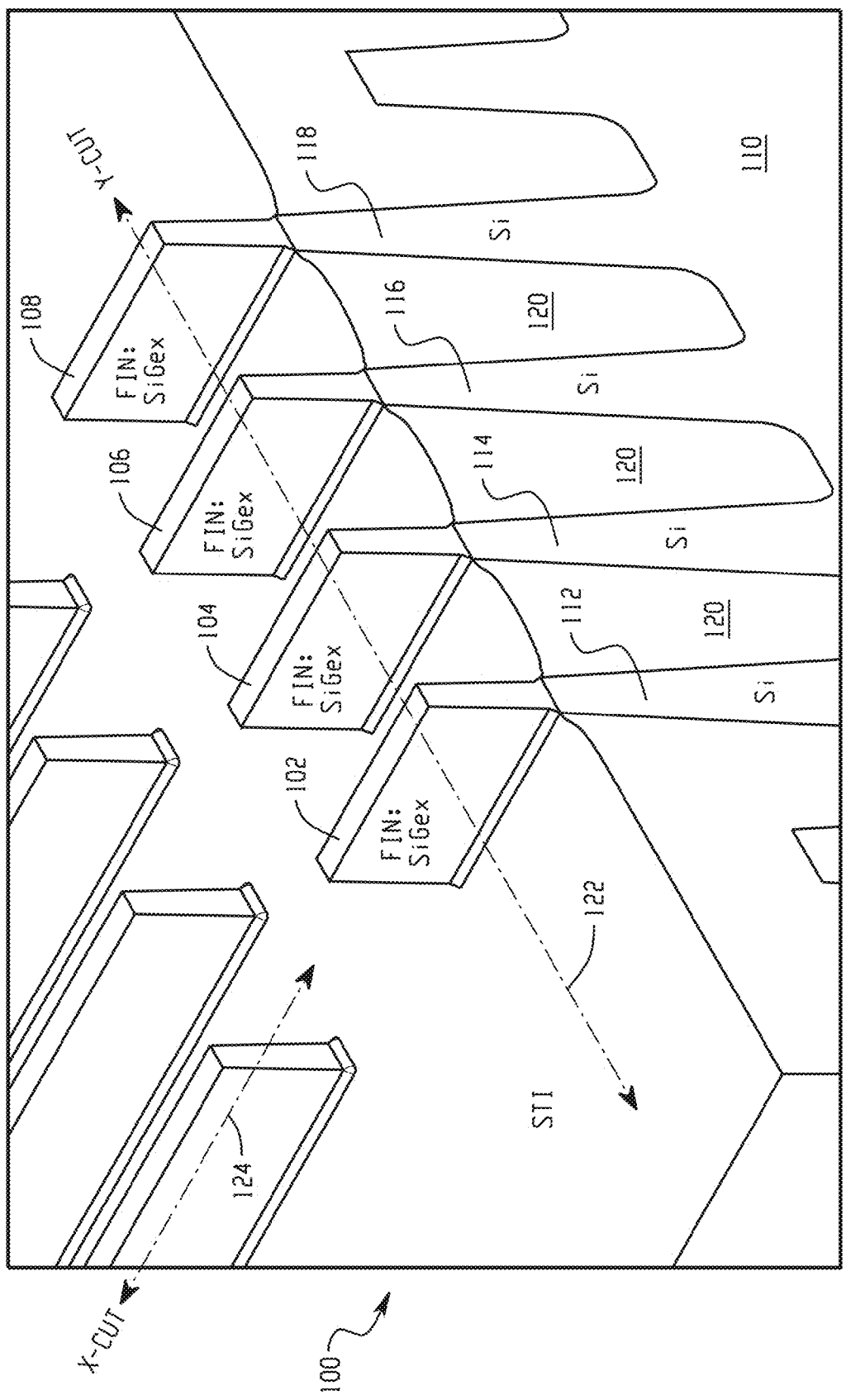
FIG. 1 depicts an example diagram showing a device structure for fabricating semiconductor devices, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underneath," "below," "lower," "above," "on," "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

To enhance device performance, strain in a transistor channel can be adjusted to achieve higher electron mobility (or hole mobility) and thereby conductivity through the channel. For a FinFET, source/drain regions can be formed through epitaxial growth, and volumes of the source/drain regions affect strain in a channel region of the FinFET. Particularly, increasing the volumes of the source/drain regions can increase the strain in the channel region of the FinFET, and thus increase the conductivity through the channel. The present disclosure describes structures and methods for increasing the volumes of certain source/drain regions so as to increase the strain in the channel region of a FinFET.

FIG. 1 depicts an example diagram showing a device structure for fabricating semiconductor devices, in accordance with some embodiments. As shown in FIG. 1, the device structure 100 includes a group of fin structures (e.g., the structures 102, 104, 106 and 108) formed approximately parallel to each other on a substrate 110 for fabricating semiconductor devices (e.g., FinFETs). Specifically, the fin structures 102, 104, 106 and 108 extend above support structures 112, 114, 116 and 118 on the substrate 110 respectively. In addition, the support structures 112, 114, 116 and 118 are separated from each other by shallow trench isolation (STI) structures (e.g., the structure 120). A cutline 122 (e.g., Y-cut) extends across the fin structures 102, 104, 106 and 108, and another cutline 124 (e.g., X-cut) extends perpendicular to the cutline 122 (e.g., Y-cut). In some embodiments, the group of fin structures approximately parallel to each other include two fin structures, three fin structure, or more than four fin structures.

In some embodiments, the substrate 110 includes silicon, germanium, silicon carbide, gallium arsenide, indium arsenide, indium phosphide, or other suitable materials. The substrate 110 may include one or more epitaxial layers, may be strained for performance enhancement, and/or may include a silicon-on-insulator structure. The STI structures (e.g., the structure 120) include silicon oxide, silicon nitride, silicon oxynitride, fluoride-doped silicate glass (FSG), and/or a low-k dielectric material. The fin structures 102, 104, 106 and 108 include silicon germanium, and the support structures 112, 114, 116 and 118 include silicon.

In certain embodiments, the device structure 100 is formed through multiple processes. For example, one or more trenches are formed through a dry etching process (e.g., inductively coupled plasma, transformer coupled plasma, electron cyclotron resonance, reactive ion etch) on the substrate 110. The trenches are then filled with one or more dielectric materials (e.g., high density plasma oxide, sub-atmospheric chemical-vapor-deposition oxide, or flowable chemical-vapor-deposition oxide) through deposition.

A chemical-mechanical polishing (CMP) process is performed to remove part of the dielectric materials.

Figure 2:
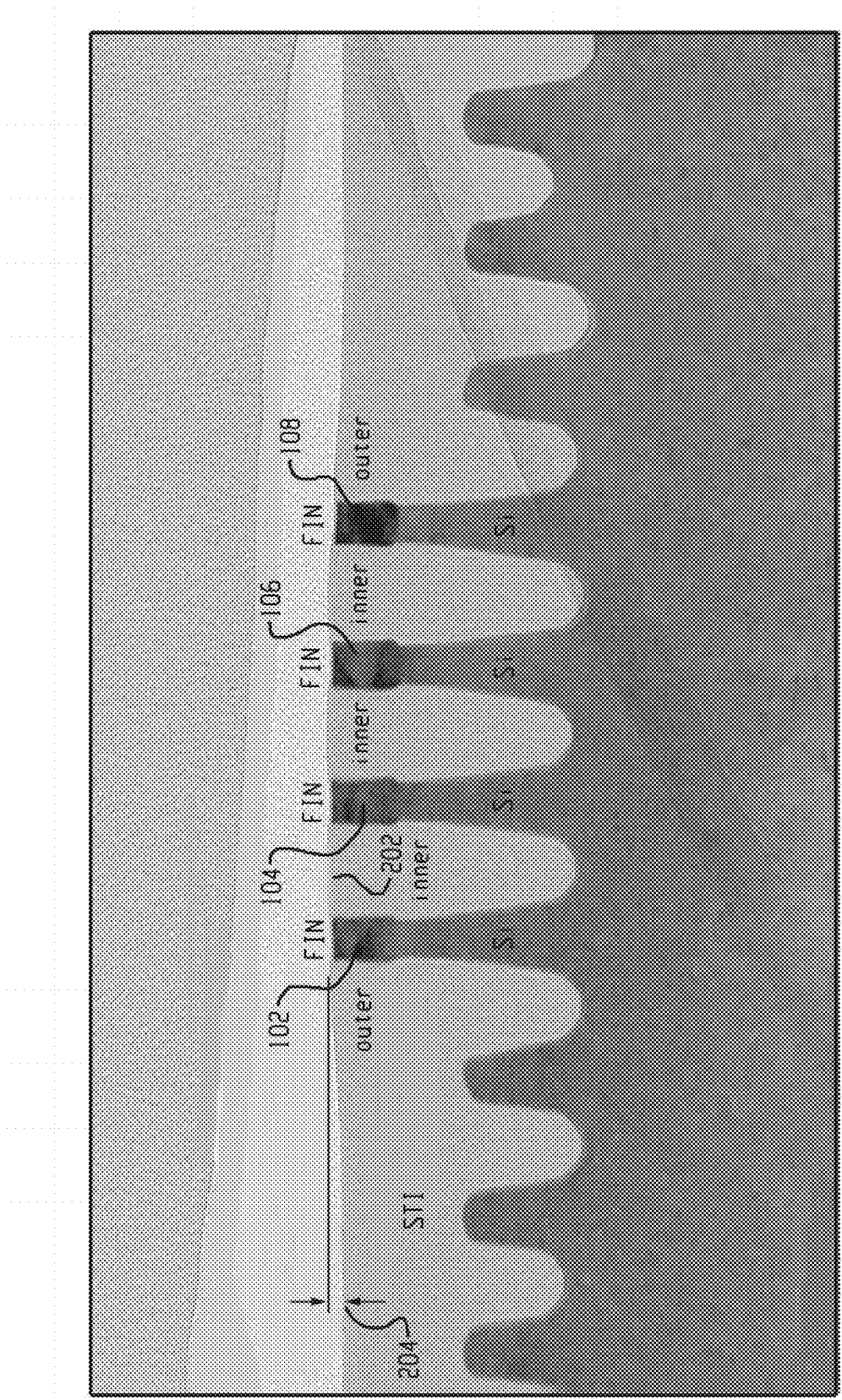
FIG. 2 depicts an example diagram showing a cross-sectional view along a cutline after a chemical-mechanical polishing process, in accordance with some embodiments.

FIG. 2 depicts an example diagram showing a cross-sectional view along the cutline 122 after the CMP process, in accordance with some embodiments. The dielectric materials on top of the fin structures 102, 104, 106 and 108 are removed during the CMP process. As shown in FIG. 2, part of the STI structure (e.g., 202) between the fin structures 102, 104, 106 and 108 (e.g., "inner" part) has a top surface higher than a top surface of another part of the STI structure (e.g., 204) in regions away from the fin structures 102, 104, 106 and 108 (e.g., "outer" part).

In some embodiments, a well implantation process is performed after the CMP process. For example, boron-based materials can be used for P-well implantation, and phosphorous-based materials or arsenic-based materials can be used for N-well implantation. A well annealing process, such as millisecond annealing, rapid thermal annealing (e.g., from about 1 second to about 3 seconds) and soak annealing (e.g., from about 10 seconds to about 30 seconds), may be carried out at a temperature in a range of about 800° C. to about 1350° C.

Figure 3:
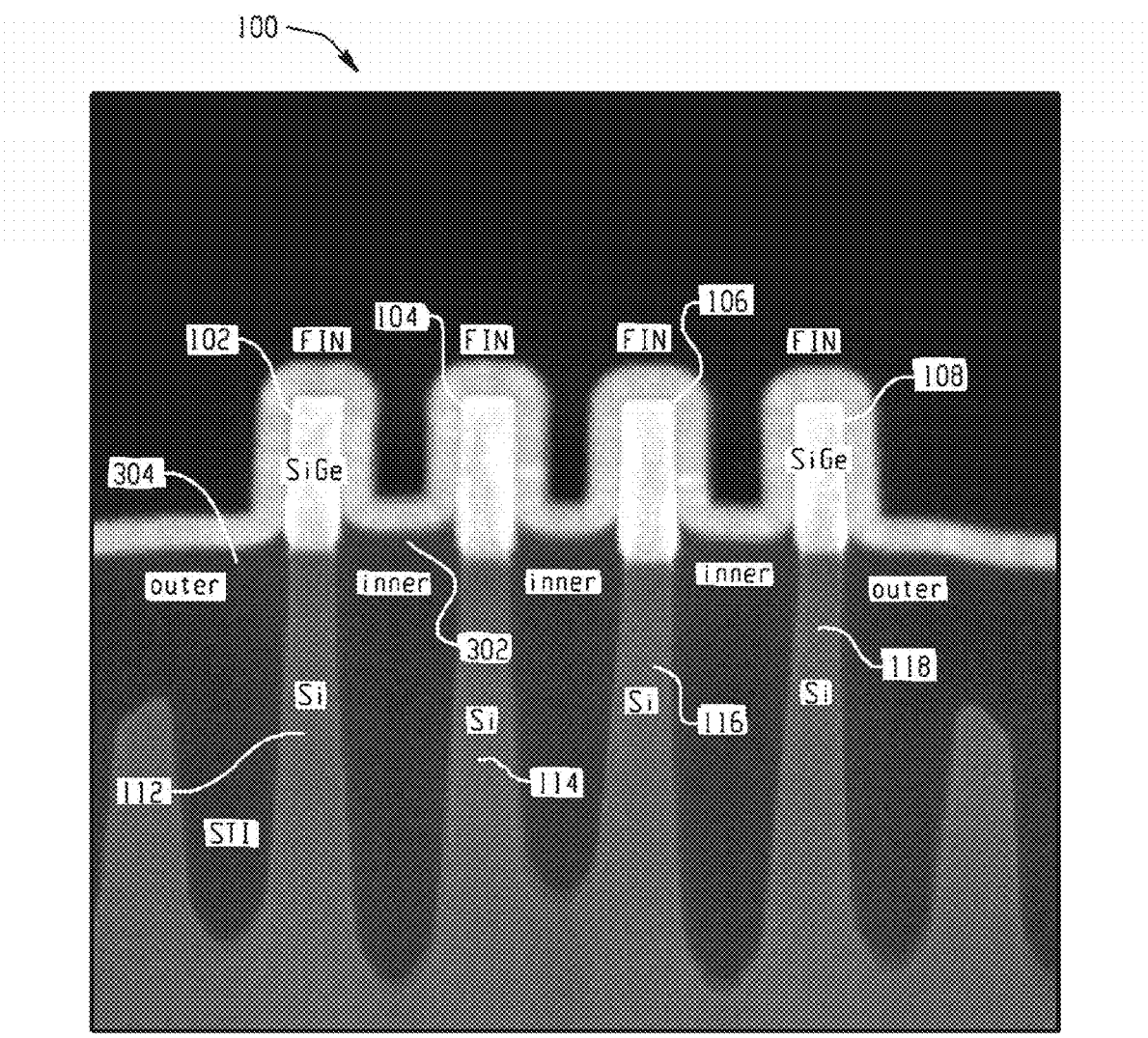
FIG. 3 depicts an example diagram showing a cross-sectional view of a device structure along a cutline, in accordance with some embodiments.

The dielectric materials in the STI structure are further removed through an etching process to generate the device structure 100, as shown in FIG. 3. For example, the dielectric materials are further removed through a dry etching process using reaction gases (e.g., a mixture of hydrogen fluoride and ammonia, or a mixture of nitrogen trifluoride and ammonia) with or without plasma. In another example, the dielectric materials are further removed through a wet etching process using a diluted hydrogen fluoride solution. As shown in FIG. 3, part of the STI structure (e.g., 302) between the fin structures 102, 104, 106 and 108 (e.g., "inner" part) has a top surface higher than an interface between the fin structure 102 and the support structure 112. Another part of the STI structure (e.g., 304) in regions away from the fin structures 102, 104, 106 and 108 (e.g., "outer" part) has a top surface lower than the interface between the fin structure 102 and the support structure 112. For example, the support structure 112 is partially exposed on the side adjacent to the outer part of the STI structure (e.g., 304).

Figure 4A:
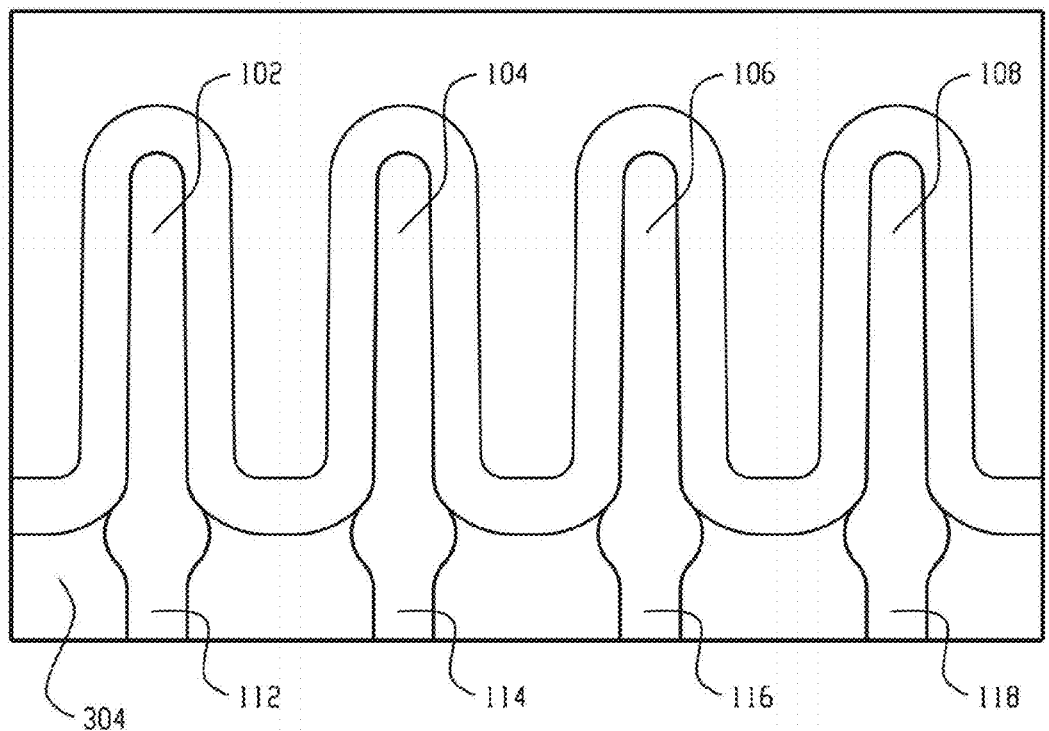
FIG. 4(A) and FIG. 4(B) depict example diagrams showing cross-sectional views of a device structure after a fin-width-reduction process, in accordance with some embodiments.
Figure 4B:
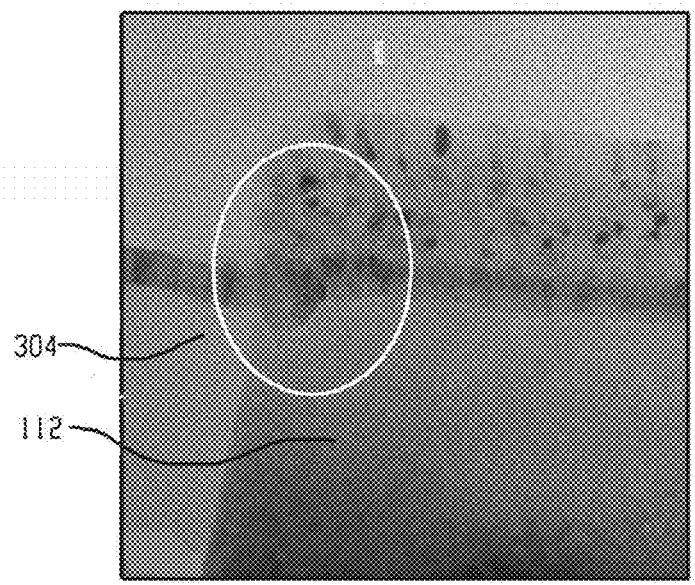

A fin-width-reduction process is performed to remove part of the fin structures 102, 104, 106 and 108, as shown in FIG. 4(A) and FIG. 4(B). FIG. 4(A) depicts an example diagram showing a cross-sectional view along the cutline 122, and FIG. 4(B) depicts an example diagram showing a cross-sectional view along the cutline 124. As shown in FIG. 4(B), part of the support structure 112 that is exposed on the side adjacent to the outer part of the STI structure (e.g., 304) is removed. The support structure 112 is etched at a higher rate than the fin structures 102, 104, 106 and 108.

In some embodiments, the fin-width-reduction process includes a wet etching process performed using a solution including ammonium hydroxide, ammonium peroxide mixture, hydrochloric acid, diluted hydrofluoric acid, or other suitable materials. The wet etching process is performed at a temperature of about 60° C. for about 270 seconds. In certain embodiments, the fin-width-reduction process includes a dry etching process performed using reaction gases (e.g., $CF_4$, $SF_6$, $BCl_3$, $Cl_2$, HBr, $O_2$, or other suitable gases), such as inductively coupled plasma, transformer coupled plasma, electron cyclotron resonance, and reactive ion etch.

Multiple processes may be performed after the fin-width-reduction process. For example, dummy gate dielectric materials and dummy gate structures (e.g., polysilicon) may be formed. Dummy gate structures are formed using processes such as photolithography, etching, and/or other suitable processes. A seal spacer is formed through deposition and etching. In addition, low-dose drain (LDD) regions are formed through implantation and annealing. Dummy spacers for N-type devices are formed through deposition and etching. N-type strained source/drain (NSSD) etching is performed, and source/drain regions for N-type devices are formed through epitaxial growth. Then, the dummy spacers for N-type devices are removed through etching. Dummy spacers for P-type devices are formed through deposition and etching. P-type strained source/drain (PSSD) etching is performed, and source/drain regions for P-type devices are formed through epitaxial growth.

Figure 5:
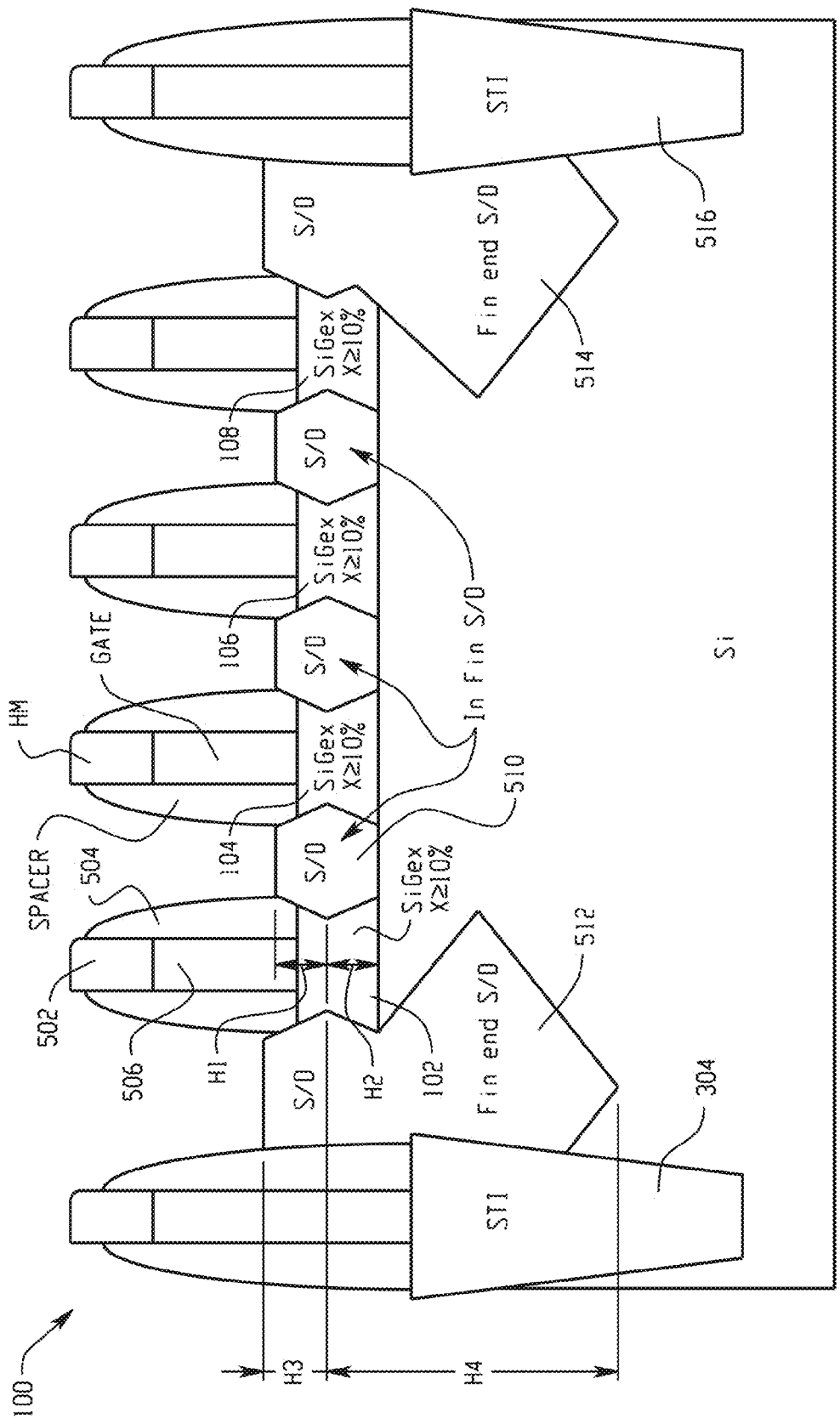
FIG. 5 depicts an example diagram showing a cross-sectional view of a device structure including source/drain regions, in accordance with some embodiments.

FIG. 5 depicts an example diagram showing a cross-sectional view of the device structure 100 including source/drain regions, in accordance with some embodiments. As shown in FIG. 5, a hard mask layer (e.g., the layer 502), a spacer (e.g., the spacer 504), and a gate structure (e.g., the structure 506) are formed on each of the fin structures 102, 104, 106 and 108. In-fin source/drain regions (e.g., the region 510) are formed through epitaxial growth between the fin structures 102, 104, 106 and 108. A fin-end source/drain region 512 is formed through epitaxial growth between the fin structure 102 and the outer part of the STI structure (e.g., 304), and another fin-end source/drain region 514 is formed through epitaxial growth between the fin structure 108 and another outer part of the STI structure (e.g., 516).

As described above, part of the support structure underneath the fin structure 102 adjacent to the outer part of the STI structure (e.g., 304) is removed during the fin-width-reduction process. Thus during epitaxial growth of the source/drain regions, the fin-end source/drain region 512 between the fin structure 102 and the outer part of the STI structure (e.g., 304) grows much larger than the in-fin source/drain regions. For example, the volume of the fin-end source/drain region 512 is much larger than the volume of the in-fin source/drain region 510. The large volume of the fin-end source/drain region 512 increases the strain in the channel of a FinFET fabricated from the device structure 100, and thus increases the conductivity through the channel. In some embodiments, the height of the fin-end source/drain region 512 is larger than the height of the in-fin source/drain region 510. In certain embodiments, the in-fin source/drain region 510 includes a top portion of a height H1 and a bottom portion of a height H2. The fin-end source/drain region 512 includes a top portion of a height H3 and a bottom portion of a height H4, where H3 is larger than H1 and H4 is larger than H2.

In some embodiments, subsequently, multiple processes are performed to fabricate FinFETs from the device structure 100. For example, the dummy spacers for P-type devices are removed through etching. A main spacer is formed through deposition and etching. A source/drain implantation process and an annealing process are performed. Hard mask layers (e.g., silicon dioxide) are removed, and a contact-etch-stop layer (CESL) is formed through deposition. In addition, an inter-layer dielectric (ILD) layer is formed through deposition, and a CMP process is performed to remove part of the ILD layer. The dummy gate structures and the dummy gate dielectric materials are removed. Then, a gate interfacial layer and a gate dielectric material (e.g., one or more high-k materials) are formed through deposition. A metal gate layer is formed through deposition.

Figure 6:
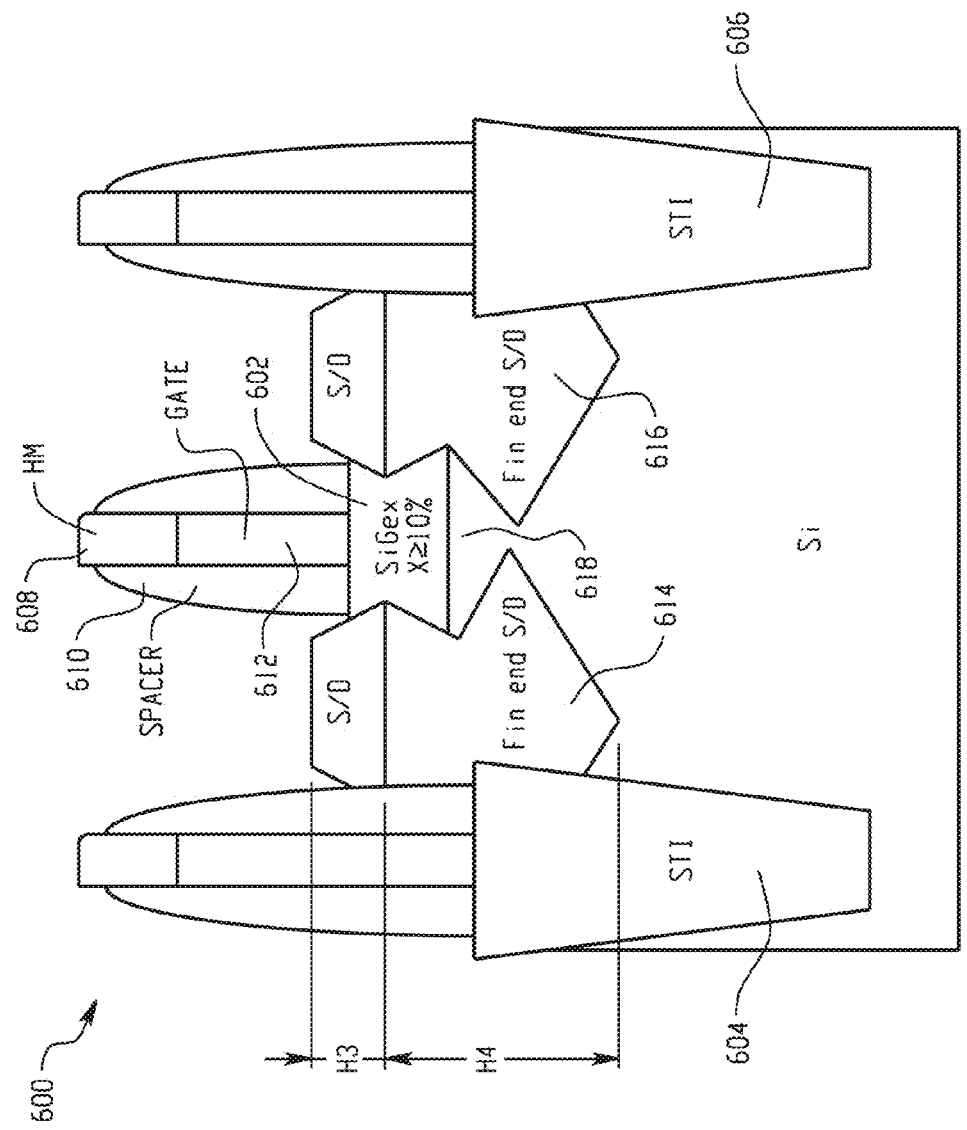
FIG. 6 depicts another example diagram showing a cross-sectional view of a device structure including source/drain regions, in accordance with some embodiments.

FIG. 6 depicts another example diagram showing a cross-sectional view of a device structure including source/drain regions, in accordance with some embodiments. As shown in FIG. 6, a single fin structure 602 is formed between two parts of a STI structure (e.g., 604 and 606). A hard mask layer 608, a spacer 610 and a gate structure 612 are formed on the fin structures 602. Part of a support structure 618 underneath the fin structure 602 adjacent the two parts of a STI structure (e.g., 604 and 606) is removed during a fin-width-reduction process. Two fin-end source/drain regions 614 and 616 are formed through epitaxial growth. A volume of a top portion of the fin-end source/drain region 614 is smaller than that of a bottom portion of the fin-end source/drain region 614. Similarly, a volume of a top portion of the fin-end source/drain region 616 is smaller than that of a bottom portion of the fin-end source/drain region 616. In some embodiments, the top portion of the fin-end source/drain region 614 has a height H3 much smaller than that of the bottom portion of the fin-end source/drain region 614.

Figure 7:
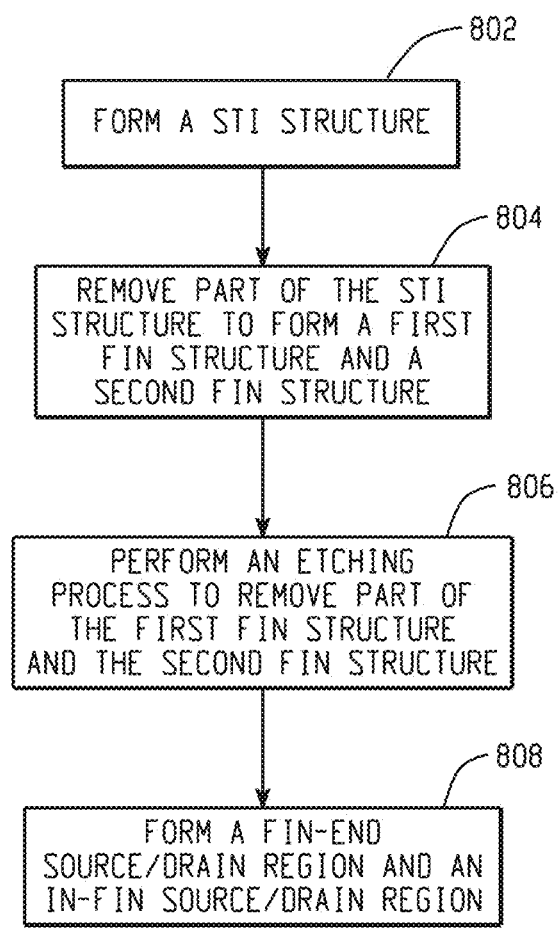
FIG. 7 depicts an example diagram showing a process for fabricating semiconductor devices, in accordance with some embodiments.

FIG. 7 depicts an example diagram showing a process for fabricating semiconductor devices, in accordance with some embodiments. At 802, a STI structure is formed on a substrate. At 804, part of the STI structure is removed to form a first fin structure and a second fin structure extending above a support structure on the substrate. A first part of the STI structure is located between the first fin structure and the second fin structure and has a first top surface higher than an interface between the first fin structure and the support structure. A second part of the STI structure is located adjacent to the first fin structure and has a second top surface lower than the interface between the first fin structure and the support structure. At 806, an etching process is performed to remove part of the first fin structure and the second fin structure, part of the support structure adjacent to the second part of the STI structure being removed during the etching process. At 808, a fin-end source/drain region is formed adjacent to the second part of the STI structure and an in-fin source/drain region is formed adjacent to the first part of the STI structure. A first volume associated with the fin-end source/drain region is larger than a second volume associated with the in-fin source/drain region.

According to one embodiment, a method is provided for fabricating semiconductor devices. A shallow trench isolation (STI) structure is formed on a substrate. Part of the STI structure is removed to form a first fin structure and a second fin structure extending above a support structure on the substrate. A first part of the STI structure is located between the first fin structure and the second fin structure and has a first top surface higher than an interface between the first fin structure and the support structure. A second part of the STI structure is located adjacent to the first fin structure and has a second top surface lower than the interface between the first fin structure and the support structure. An etching process is performed to remove part of the first fin structure and the second fin structure. Part of the support structure adjacent to the second part of the STI structure is removed during the etching process.

According to another embodiment, a device structure includes a first fin structure, a second fin structure, one or more gate structures, a first in-fin source/drain region, and a fin-end source/drain region. The first fin structure is formed on a substrate. The second fin structure is formed on the substrate. The one or more gate structures are formed on the first fin structure and the second fin structure. The first in-fin source/drain region is associated with a first volume and is disposed between the first fin structure and the second fin structure. The fin-end source/drain region is associated with a second volume larger than the first volume. The first fin structure is disposed between the first in-fin source/drain region and the fin-end source/drain region. The gate structures, the first in-fin source/drain region, and the fin-end source/drain region are configured to form one or more transistors.

According to yet another embodiment, a device structure includes a fin structure, a gate structure, a first source/drain region, and a second source/drain region. The fin structure is formed on a substrate. The gate structure is formed on the fin structure. The first source/drain region includes a first top portion associated with a first volume and a first bottom portion associated with a second volume larger than the first volume. The second source/drain region includes a second top portion associated with a third volume and a second bottom portion associated with a fourth volume larger than the third volume. The gate structure, the first source/drain region and the second source/drain region are configured to form a transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a shallow trench isolation (STI) structure on a substrate;
    removing part of the STI structure to form a first fin structure and a second fin structure extending above a support structure on the substrate;
    wherein:
        a first part of the STI structure is located between the first fin structure and the second fin structure and has a first top surface higher than an interface between the first fin structure and the support structure; and
        a second part of the STI structure is located adjacent to the first fin structure and has a second top surface lower than the interface between the first fin structure and the support structure;
    performing an etching process to remove part of the first fin structure and the second fin structure, part of the support structure adjacent to the second part of the STI structure being removed during the etching process; and
    forming a fin-end source/drain region adjacent to the second part of the STI structure and an in-fin source/drain region adjacent to the first part of the STI structure, a first volume associated with the fin-end source/drain region being larger than a second volume associated with the in-fin source/drain region.

2. The method of claim 1, wherein:
    at least part of the fin-end source/drain region is formed in a space where part of the support structure adjacent to the second part of the STI structure is removed during the etching process.

3. The method of claim 1, wherein the support structure is removed at a higher rate than the first fin structure and the second fin structure during the etching process.

4. The method of claim 1, wherein one or more third fin structures are formed adjacent to the second fin structure upon the removal of part of the STI structure.

5. The method of claim 1, wherein the fin-end source/drain region and the in-fin source/drain region are formed through epitaxial growth.

6. The method of claim 1, wherein the etching process is performed using a solution including ammonium hydroxide, ammonium peroxide mixture, hydrochloric acid, or diluted hydrofluoric acid.

7. The method of claim 6, wherein the etching process is performed at a temperature of about 60° C. for about 270 seconds.

8. The method of claim 1, wherein the etching process includes a dry etching process.

9. The method of claim 1, wherein:
the first fin structure includes silicon germanium; and
the second fin structure includes silicon germanium.

10. The method of claim 9, wherein:
the first fin structure and the second fin structure include silicon germanium with a germanium content larger than or equal to about 10%.

11. The method of claim 1, wherein:
the in-fin source/drain region includes a first top portion associated with a first height and a first bottom portion associated with a second height;
the fin-end source/drain region includes a second top portion associated with a third height and a second bottom portion associated with a fourth height;
the fourth height is larger than the second height; and
the third height is larger than the first height.

12. The method of claim 1, wherein the support structure includes silicon.

13. The method of claim 1, wherein:
the in-fin source/drain region is associated with a first height; and
the fin-end source/drain region is associated with a second height larger than the first height.

14. A method comprising:
providing a device structure including
an outer support structure, and
an outer fin structure that extends above the outer support structure;
performing an etching process that removes the outer support structure and a portion of the outer fin structure, wherein the outer support structure is removed at a higher rate than the outer fin structure; and
forming an outer source/drain region such that
a first portion of the outer source/drain region is disposed in the outer fin structure, and
a second portion of the outer source/drain region is disposed in the outer support structure.

15. The method of claim 14, wherein the device structure further includes an isolation structure that surrounds the outer fin structure and the outer support structure, the method further comprising performing a first etching process on the isolation structure to partially expose the outer support structure.

16. The method of claim 14, wherein the device structure further includes an inner support structure and an inner fin structure that extends above the inner support structure, the method further comprising forming an inner source/drain region-such that the second portion of the outer source/drain region has a height greater than a height of the inner source/drain region.

17. A method comprising:
providing a device structure including
a support structure, and
a fin structure that extends above the support structure;
performing an etching process that removes the support structure and a portion of the fin structure, wherein the support structure is removed at a higher rate than the fin structure; and
forming a pair of source/drain regions, each of which has a first portion disposed in the fin structure and a second portion disposed in the support structure.

18. The method of claim 17, wherein the device structure further includes
a gate structure that extends transverse to the fin structure, that is disposed between the source/drain regions, and that has a pair of sidewalls, and
a pair of spacer structures, each of which is disposed on a respective one of the sidewalls, the source/drain regions being formed such that a distance between the second portions thereof is less than a distance between the spacer structures.

19. The method of claim 17, wherein the device structure further includes
a gate structure that extends transverse to the fin structure, that is disposed between the source/drain regions, and that has a pair of sidewalls, and
a pair of spacer structures, each of which is disposed on a respective one of the sidewalls, the source/drain regions being formed such that a distance between the first portions thereof is greater than a distance between the spacer structures.

* * * * *